(12) United States Patent
Varieur et al.

(10) Patent No.: US 10,077,575 B2
(45) Date of Patent: Sep. 18, 2018

(54) DOOR LOCK EXTENDER AND METHOD OF USE

(71) Applicant: Tyco Fire & Security GmbH, Neuhausen am Rheinfall (CH)

(72) Inventors: Steven T. Varieur, Winchendon, MA (US); James T. Roberts, Amherst, NH (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 0 days.

(21) Appl. No.: 14/943,751

(22) Filed: Nov. 17, 2015

(65) Prior Publication Data

US 2017/0142854 A1 May 18, 2017

(51) Int. Cl.
| | |
|---|---|
| *E05B 15/10* | (2006.01) |
| *H05K 5/02* | (2006.01) |
| *E05C 3/12* | (2006.01) |
| *E05C 3/14* | (2006.01) |
| *E05B 63/00* | (2006.01) |
| *E05C 17/00* | (2006.01) |
| *G08B 17/00* | (2006.01) |

(52) U.S. Cl.
CPC .......... *E05B 15/10* (2013.01); *E05B 63/0056* (2013.01); *E05C 3/12* (2013.01); *E05C 3/145* (2013.01); *E05C 17/00* (2013.01); *H05K 5/0221* (2013.01); *H05K 5/0247* (2013.01); *G08B 17/00* (2013.01)

(58) Field of Classification Search
CPC ..... E05C 3/00; E05C 3/12; E05C 3/14; E05C 3/145; E05C 17/00; E05C 17/04; E05C 17/047; E05C 17/42; E05C 17/54; E05B 15/10; E05B 15/102; E05B 63/0056; E05B 63/006; E05B 63/06
See application file for complete search history.

(56) References Cited

U.S. PATENT DOCUMENTS

| 1,447,846 | A | * | 3/1923 | Hill | E05C 19/08 |
| | | | | | 292/262 |
| 4,593,946 | A | * | 6/1986 | Rich | E05C 17/047 |
| | | | | | 292/262 |
| 5,165,742 | A | | 11/1992 | Frayne | |
| 5,234,236 | A | * | 8/1993 | Gromotka | E05B 63/0056 |
| | | | | | 292/194 |
| 7,172,224 | B2 | * | 2/2007 | Carter | E05C 17/042 |
| | | | | | 292/262 |
| 8,231,152 | B2 | * | 7/2012 | Carlson | E05C 17/042 |
| | | | | | 24/599.6 |
| 8,459,703 | B2 | * | 6/2013 | Anderson | E05B 63/0056 |
| | | | | | 292/194 |

(Continued)

*Primary Examiner* — Christopher J Boswell
(74) *Attorney, Agent, or Firm* — HoustonHogle LLP

(57) ABSTRACT

A door lock extender and method of using the door lock extender in connection with a control panel box. The door lock extender includes an extender base having a lock slot for accepting a tang latch of a lock and an extender latch that is configured to engage a catch member of a control panel box. In use, the tang latch of the lock is inserted into the lock slot of the extender base. The extender latch engages the catch member on a housing of the control panel box locking a door to the housing while providing sufficient clearance for passage of a cable between the door and the housing.

18 Claims, 7 Drawing Sheets

(56) References Cited

U.S. PATENT DOCUMENTS

| | | | | |
|---|---|---|---|---|
| 8,491,020 B2* | 7/2013 | Lopes | ................... | E05C 3/042 |
| | | | | 292/1 |
| 9,605,454 B2* | 3/2017 | Ramsauer | ............... | E05C 3/042 |
| 9,752,350 B2* | 9/2017 | Davis | .................. | E05L 317/005 |
| 2004/0244683 A1* | 12/2004 | Beckord | ............ | B05B 13/0292 |
| | | | | 118/500 |
| 2011/0302971 A1* | 12/2011 | Bui | .................... | E05L 31/0007 |
| | | | | 70/461 |

* cited by examiner

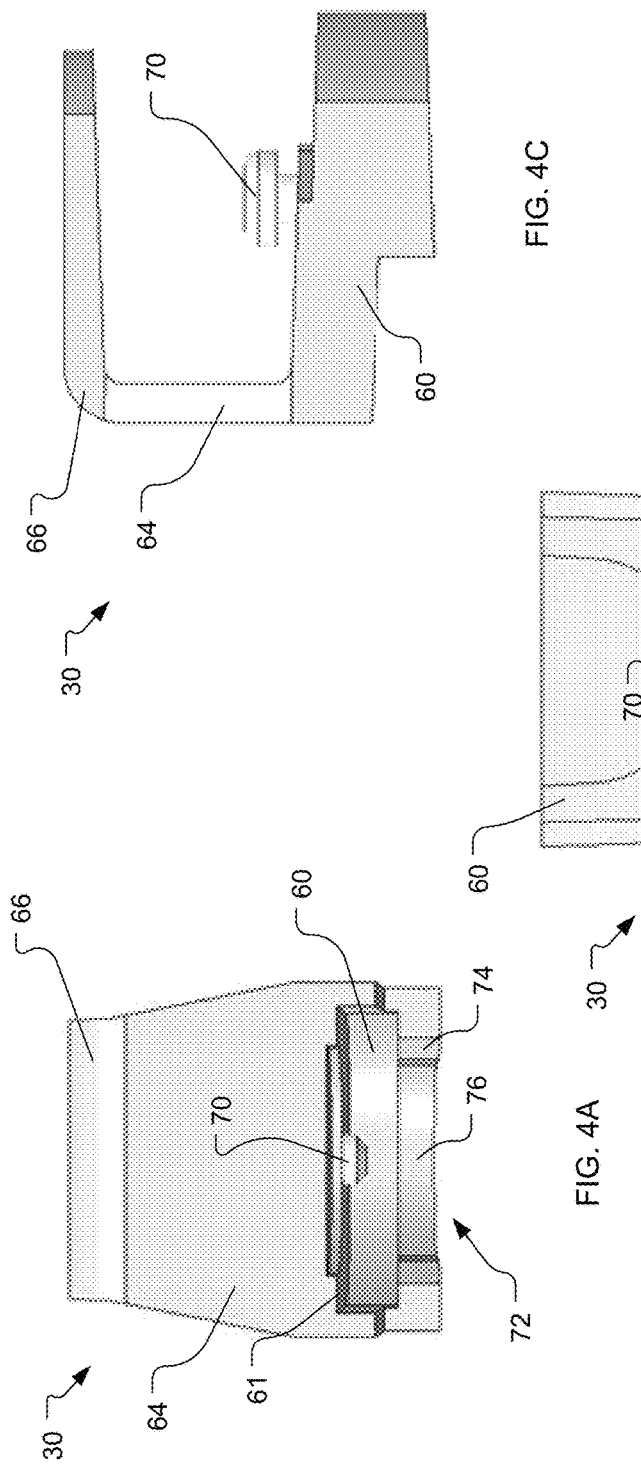

DOOR LOCK EXTENDER AND METHOD OF USE

BACKGROUND OF THE INVENTION

Fire alarm systems are often installed within commercial, residential, or governmental buildings. Examples of these buildings include hospitals, warehouses, schools, hotels, shopping malls, government buildings, and casinos. The fire alarm systems monitor fire conditions, such as smoke or heat, and alert occupants when the detected fire conditions are potentially indicative of fire.

The fire alarm systems typically include a control panel, fire detectors, and notification devices connected to one another via an emergency network. The control panel is typically housed in a bay of a control panel box, which might be installed in a utility closet or a public area (e.g., lobbies of hotels). The fire detectors (e.g., smoke detectors, carbon monoxide detectors, and temperature sensors) detect the fire conditions and then send alarm signals to the control panel via the emergency network when the detected smoke, carbon monoxide, or temperature exceeds a threshold, for example. The control panel responds to the alarm signals by activating notification devices (e.g., speakers, strobes, and/or strobe/speaker combo devices) that alert occupants of the potential fire.

Typically, fire detectors are periodically tested (e.g., monthly, quarterly, or annually depending on fire or building codes) to verify that the fire detectors are physically sound, unaltered, working properly, not obstructed, properly labeled, and located in their assigned locations. Testing of the fire detectors is often accomplished by a serviceperson performing a walkthrough test.

During the walkthrough test, the serviceperson moves through the building to activate fire detectors while the control panel is in a test mode. The serviceperson can activate fire detectors by, for example, applying real or artificial smoke to the fire detectors. Upon activation, the fire detectors send the alarm signals to the control panel. A service box, connected to the control panel, records results of this walkthrough test.

The service box is connected to the control panel using a cable harness. The serviceperson plugs one end of the cable harness into a control panel connector of the control panel. The other end of the cable harness is routed out of the control panel box and plugged into a service box connector of the service box.

SUMMARY OF THE INVENTION

The walkthrough test can create a security problem for the control panel box while the control panel is connected to the service box. Often, the door to the control panel box will remain open and unlocked in order to provide enough clearance for the cable harness to be routed out of the control panel box to the service box. Thus, this setup can create a security problem should the serviceperson leave the open control box unattended. This is especially a problem where the control panel box is left unattended in a public space (e.g., shopping malls or lobbies of hotels).

There is a need for a way to lock and secure the control panel box while the control panel is connected to the service box. In particular, there is a need for a way to lock the security panel box while providing sufficient clearance for passage of the cable harness from the control panel to the service box.

Embodiments of the present invention feature a door lock extender that provides a solution to the above problem and need. The door lock extender is installed such that the door can be locked to a housing of the control panel box while providing sufficient clearance for passage of the cable harness between the door and the housing without crimping or pinching the cable harness between the door and the housing of the control panel box.

The embodiments can be used with different types of locks for control panel boxes. Doors for control panel boxes typically include one of three different cam locks. When compared to one another, the cam locks include tang latches that only vary in length and depth but have the same width. The door lock extender has a lock slot that is designed to receive any of these tang latches. This allows for the door lock extender to be used with different cam locks for control panel boxes.

In general, according to one aspect, the invention features a door lock extender for a control panel box, including an extender base having a lock slot for accepting a tang latch of a lock and an extender latch that is configured to engage a catch member of a control panel box.

Preferably, the extender latch extends perpendicularly from a wall such that the wall and extender latch form a bracket. The extender latch can extend from the wall such that the wall and extender latch preferably form an L-shaped bracket.

The extender base has a base aperture that accepts a screw for securing the extender base to the tang latch of the lock. The extender latch further includes a latch aperture for receiving a screwdriver for turning the screw.

The extender base further includes a stepped base surface for reinforcing the engagement between the extender latch and the catch member.

The extender base and the extender latch are preferably made from a die-cast alloy.

The lock slot can further include a lip section and a relief section.

In general, according to another aspect, the invention features a control panel box including a housing. There is at least one bay in the housing for holding a control panel. The control panel box includes a door for the housing enabling access to the at least one bay. The door has a lock for securing the door to the housing. The control panel box includes a door lock extender that enables the door to be locked to the housing while providing sufficient clearance for passage of a cable between the door and the housing.

In general, according to another aspect, the invention features a method of using a door lock extender for a control panel box, comprising providing the control panel box having a housing and a door with a lock for securing the door to the housing. The provided door lock extender has an extender base and an extender latch. A tang latch of the lock is inserted into a lock slot of the extender base. The extender latch engages a catch member on the housing of the control panel box locking the door to the housing while providing sufficient clearance for passage of a cable between the door and the housing.

The method can further include a step of fastening the extender base to the tang latch with a screw.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 4A is a back plan view of the door lock extender in FIG. 3B;

FIG. 4B is a bottom plan view of the door lock extender in FIG. 3B;

FIG. 4C is a side plan view of the door lock extender in FIG. 3B;

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Figure 1A:
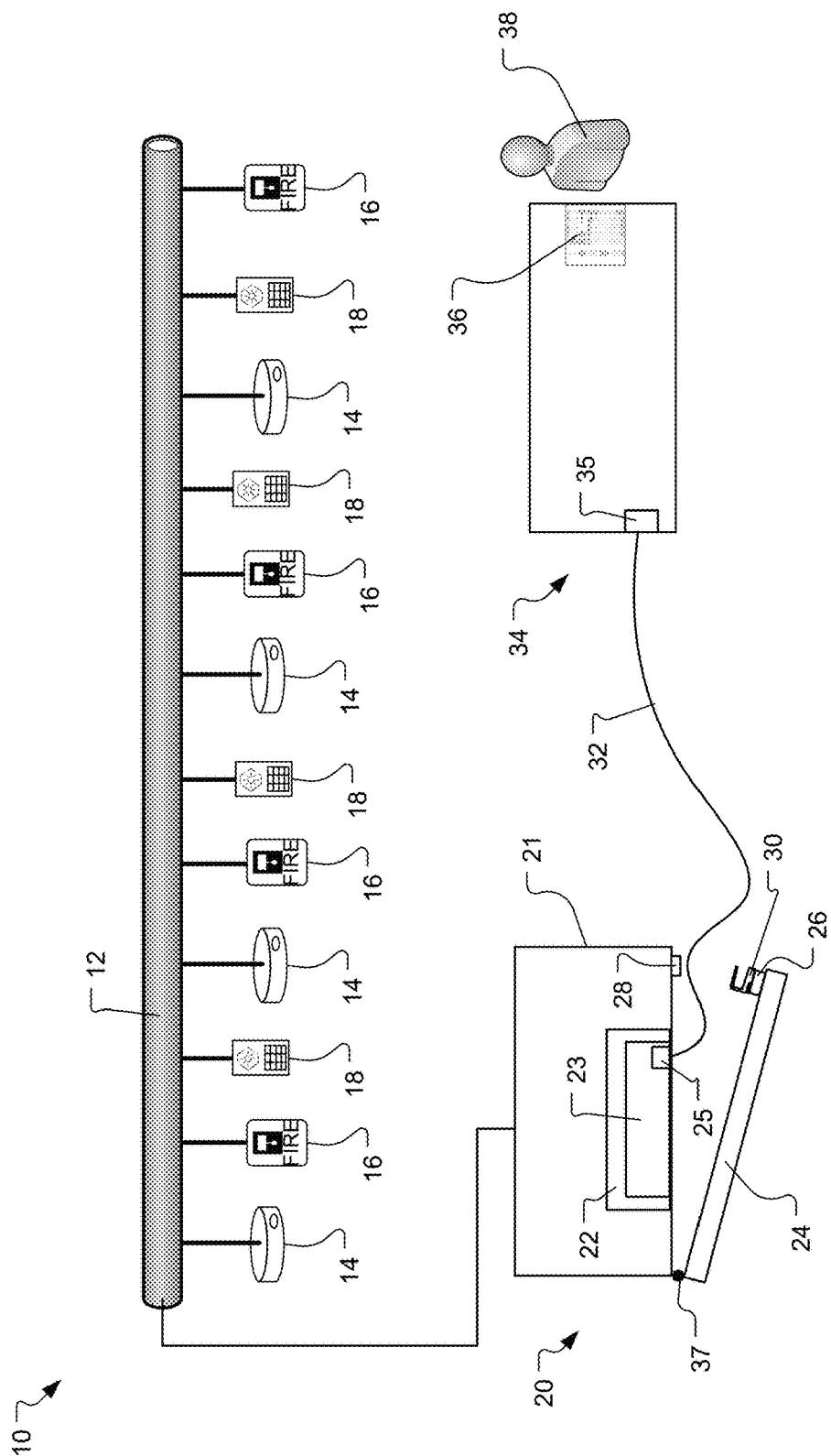
FIG. 1A is a schematic diagram of a fire alarm system prior to a walkthrough test.
Figure 1B:
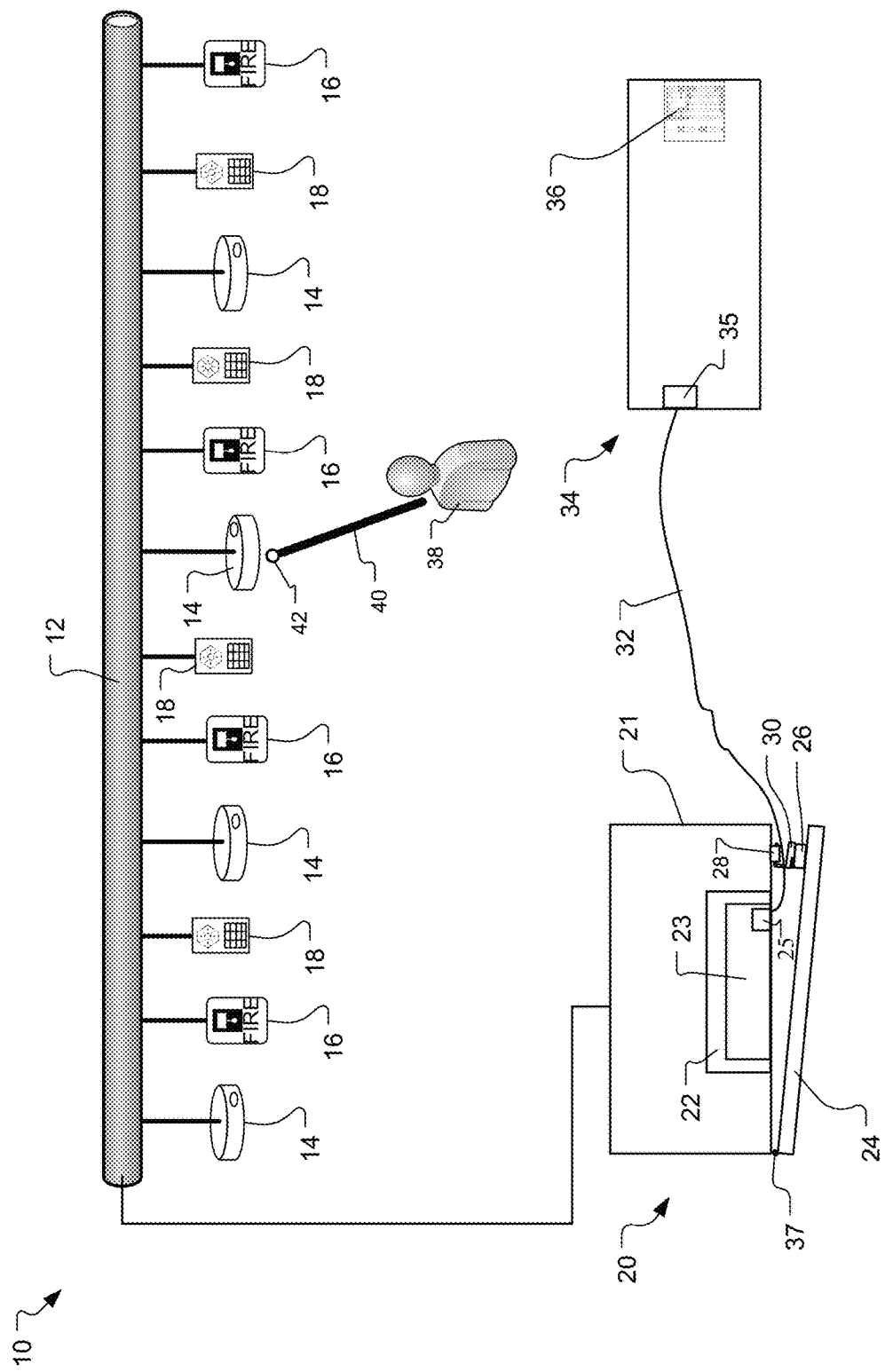
FIG. 1B is another schematic diagram of the fire alarm system in FIG. 1A during the walkthrough test.

FIGS. 1A-1B depict a fire alarm system 10 that utilizes a door lock extender 30, according to principles of the present invention. In general, the door lock extender 30 is installed such that a door 24 can be locked to a housing 21 of a control panel box 20, which houses a control panel 23, while providing sufficient clearance for passage of a cable harness 32 between the door 24 and the housing 21 without crimping or pinching the cable harness 32 between the door 24 and the housing 21 of the control panel box 20.

The fire alarm system 10 includes the control panel 23, fire detectors 14, pull stations 16, and notification devices 18 connected to one another via an emergency network 12. The control panel 23 uses the emergency network 12 to communicate with fire detectors 14, pull stations 16, and notification devices 18. The fire detectors 14 (e.g., smoke detectors, carbon monoxide detectors, and temperature sensors) detect fire conditions (e.g., smoke, heat, or carbon monoxide) and then send alarm signals to the control panel 23 when the detected smoke, carbon monoxide, or temperature exceeds a threshold, for example. In response, the control panel 23 activates notification devices 18 (e.g., speakers, strobes, and/or strobe/speaker combo devices) that alert occupants of the potential fire.

The control panel box 20 includes the housing 21, the door 24 connected to the housing 21, and a catch member 28 on the housing. The housing 21 is a box-shaped structure. The housing 21 defines a bay 22 within its box-shaped structure. The control panel 23 is installed and held in the bay 22. For example, the control panel 23 can be mounted to a surface in the bay 22. The door 24 opens to provide access to the bay 22. The door 24 is mounted to the housing 21 via a hinge 37 such that the door 24 opens and closes. Further, the door 24 has a lock 26 for securing the door 24 to the housing 21. The lock 26 is configured to engage the catch member 28 on the housing 21 for locking the door 24 to the housing 21. In examples, the control panel box 20 can be a Simplex® 4100+, 4100U, 4100ES, 4100 classic, 4010, 4010ES, 4007ES or 4020 control panel box.

FIGS. 1A-1B depict the fire alarm system 10 in use prior to and during the walkthrough test. As described above, the walkthrough test is intended to verify that fire detectors 14 are physically sound, unaltered, working properly, not obstructed, properly labeled, and located in their assigned locations.

As illustrated in FIG. 1A, the control panel 23 is connected to a service box 34 using the cable harness 32 prior to the walkthrough test. One end of the cable harness 32 is plugged into a control panel connector 25 of the control panel 23. The other end of the cable harness 32 is routed out of the control panel box 20 and plugged into a service box connector 35 of the service box 34. The cable harness 32 can be a 10 pin to 10 pin cable harness. For example, the cable harness 32 can include at least one cable such as an RS-232 cable fitted with connectors that can be plugged into the control panel connector 25 and the service box connector 35. Alternatively, the cable harness 32 can be a universal serial bus (USB) cable or Ethernet (IEEE 802.3) patch cable (e.g., Cat 5 or Cat 6).

While connected, the service box 34 monitors the control panel 23. For example, the service box 34 is configured to monitor whether alarm signals were received by the control panel 23 from the fire detectors 14 during the walkthrough test. The alarm signals can include location and/or address information of the activated fire detectors 14. Thus, the serviceperson 38 can use the service box 34 to verify if a particular fire detector 14 is working properly based on the location and/or address information received in the alarm signals. A serviceperson 38 can use a service keypad 36 of the service box 34 to configure the service box 34 for monitoring of the control panel 23. For example, the serviceperson 38 may use the service keypad 36 to adjust settings of the service box 34. In one example, the service box 34 is an ExacTech ST1 box.

FIG. 1B depicts the fire alarm system 10 in use during the walkthrough test. During the walkthrough test, the serviceperson 38 moves through the building to activate fire detectors 14 while the control panel 23 is in test mode and connected to the service box 34. The serviceperson 38 activates the fire detectors 14 using a testing apparatus 40. The testing apparatus 40 includes a smoke port 42 for releasing real or artificial smoke at the distal end of the testing apparatus 40. The serviceperson 38 initiates the testing apparatus 40 to introduce the smoke from the smoke port 42 to a nearby fire detector 14. In other examples, the testing apparatus 40 can further include a hood that is placed over the fire detector 14. The hood surrounds the fire detector 14 while the smoke port 42 of the testing apparatus 40 introduces the smoke into the hood. The smoke has the effect of activating the fire detectors 14. Upon activation, the fire detectors 14 send the alarm signals to the control panel 23. The service box 34 records results of the walkthrough test (e.g., whether certain fire detectors 14 responded properly to smoke) from the control panel 23 while the control panel 23 is in the test mode.

During the walkthrough test, the door lock extender 30 enables the control panel box 20 to be locked and secured while the control panel 23 is connected to the service box 34. The door lock extender 30 is attached to the lock 26 allowing the door 24 to be locked to the housing 21 while providing sufficient clearance for passage of the cable harness 32 between the door 24 and the housing 21. This clearance allows for the cable harness 32 to be plugged into the control panel 23 at one end of the cable harness 32 and the service box 34 at the other end of the cable harness 32. In one example, the clearance is a gap having a length of less than 1 centimeter. Thus, the door 24 can be locked while the service box 34 is connected to the control panel 23 eliminating potential security problems during the walkthrough test.

Figure 2A:
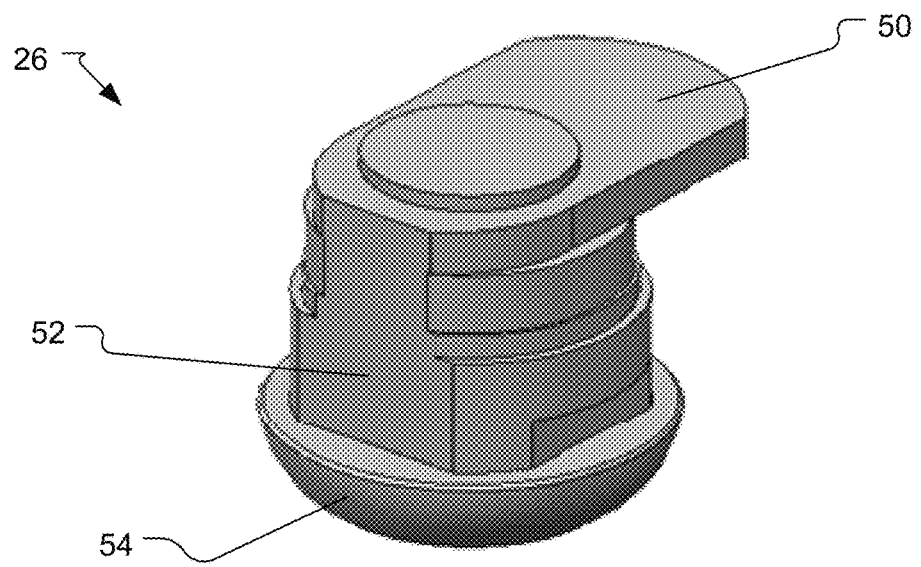
FIGS. 2A-2B are top and bottom perspective views of a lock for a door of a control panel box.
Figure 2B:
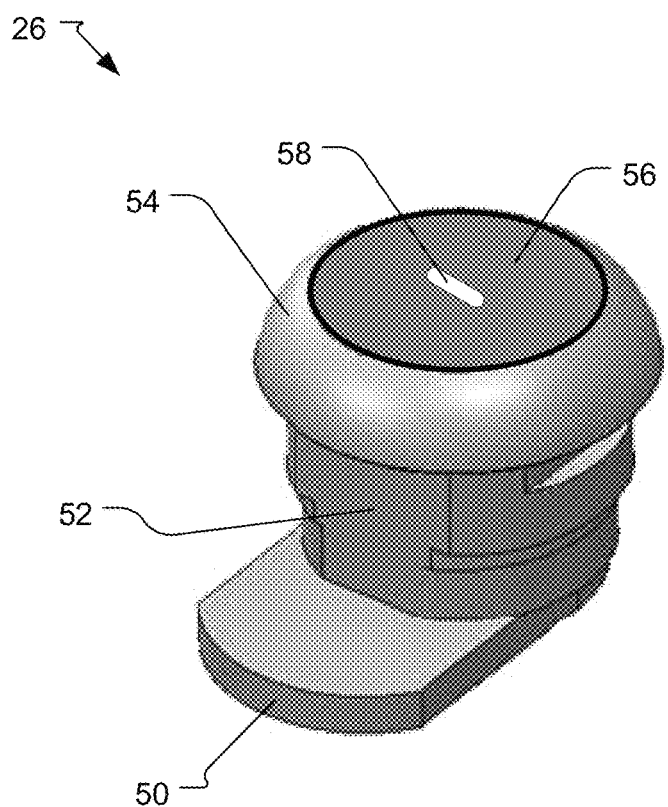
Figure 3A:
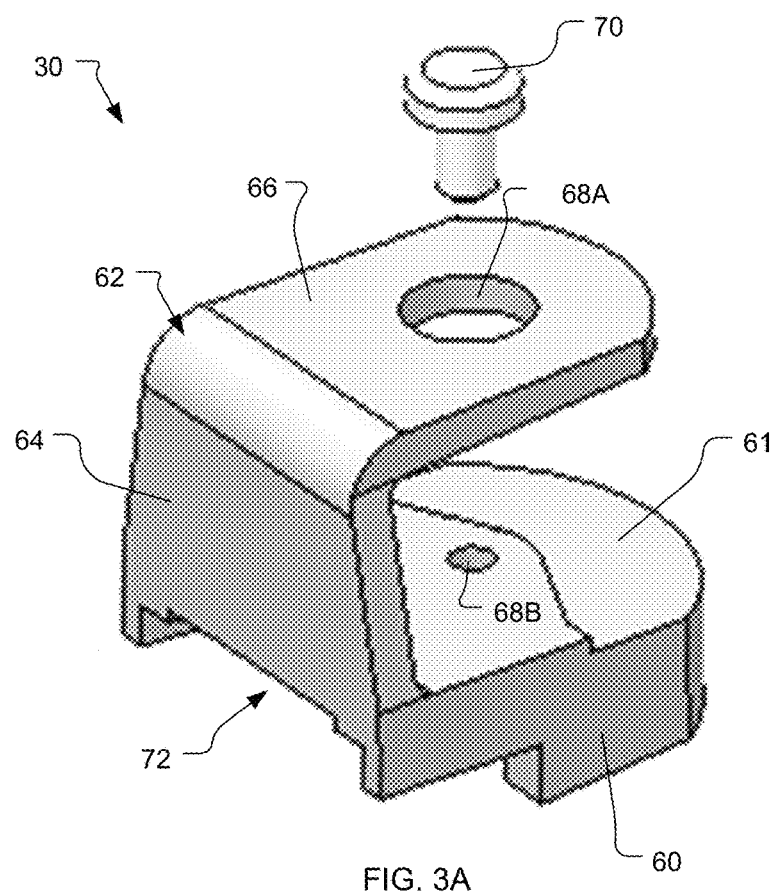
FIG. 3A is a perspective exploded view of a door lock extender according to the present invention.
Figure 3B:
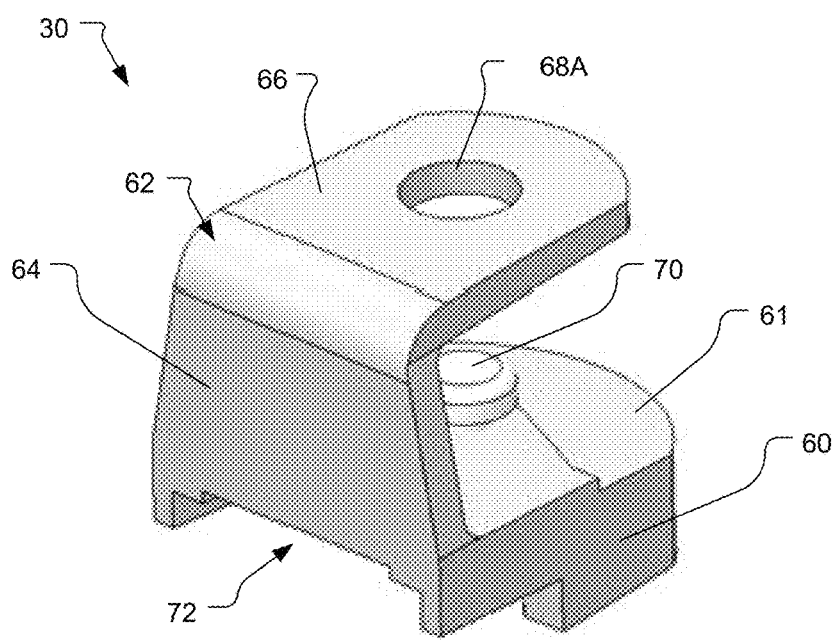
FIG. 3B is a perspective view of the door lock extender in FIG. 3A.

FIGS. 2A-2B are detailed views of the lock 26 for the control panel box 20. FIG. 2A is a top view of the lock 26 and FIG. 2B is a bottom view of the lock 26. The lock 26 is a cam type lock. The lock 26 includes a tang latch 50, a lock base 52, and a lock core 54. A locking plug 56 fits within the lock core 54. The locking plug 56 has a key opening 58 that receives a key. In use, the key can be inserted into the key opening 58 of the locking plug 56. Then, the key is turned clockwise or counterclockwise to cause the lock 26 to rotate between a locked position or an unlocked position. In the locked position, the tang latch 50 of the lock 26 typically engages the catch member 28 locking the door 24 to the housing 21.

FIGS. 3A-3B and 4A-4C are different views (e.g., perspective exploded, perspective, back plan, bottom plan, and side plan) of the door lock extender 30.

The door lock extender 30 includes an extender base 60. The extender base 60 has a tang latch lock slot 72 for accepting the tang latch 50 of the lock 26. As shown in FIG. 4A, the tang latch lock slot 72 is specifically formed by a lip section 74 and a relief section 76 to slide over and provide a secure fit with the tang latch 50. The extender base 60 has a stepped base surface 61 for reinforcing the engagement between the door lock extender 30 and the catch member 28. The extender base 60 has a base aperture 68B that accepts a screw 70 for securing the extender base 60 to the tang latch 50 of the lock 26.

The door lock extender 30 includes a bracket 62 formed by a wall 64 and an extender latch 66 such that it has an overall "U" shape when viewed from the side. The wall 64 extends from the extender base 60 (e.g., extends perpendicular to the extender base 60). The extender latch 66 extends perpendicularly from the wall 64 (i.e., the extender latch 66 is parallel with the extender base 60). Thus, the extender latch 66 engages the catch member 28 of the control panel box 20. The extender latch 66 further includes a latch aperture 68A for receiving a screwdriver screwing the screw 70 into the base aperture 68B. In one example, the bracket 62, formed by the wall 64 and the extender latch 66, is an L-shaped bracket.

The door lock extender 30 is made from rigid and tough materials that allow it to securely lock the door 24 to the housing 21. In one example, the door lock extender 30 is made from a die-cast alloy. The door lock extender 30 can be made from other materials that allow it to lock the door 24, as appreciated by one of skill in the art.

Figure 5B:
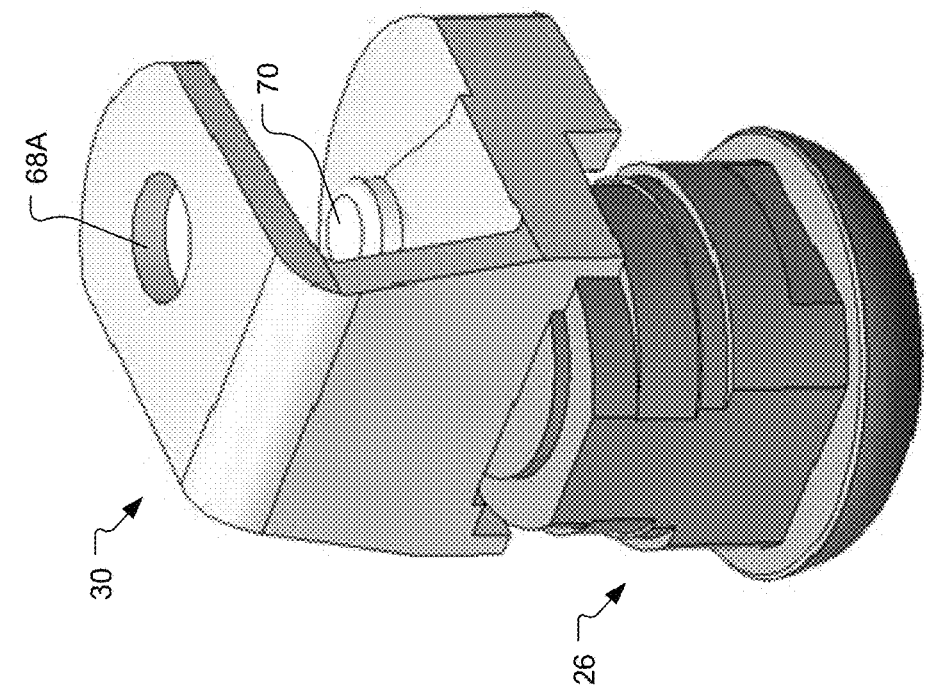
FIGS. 5A-5B are perspective views illustrating a process of installing the door lock extender to the lock.
Figure 5A:
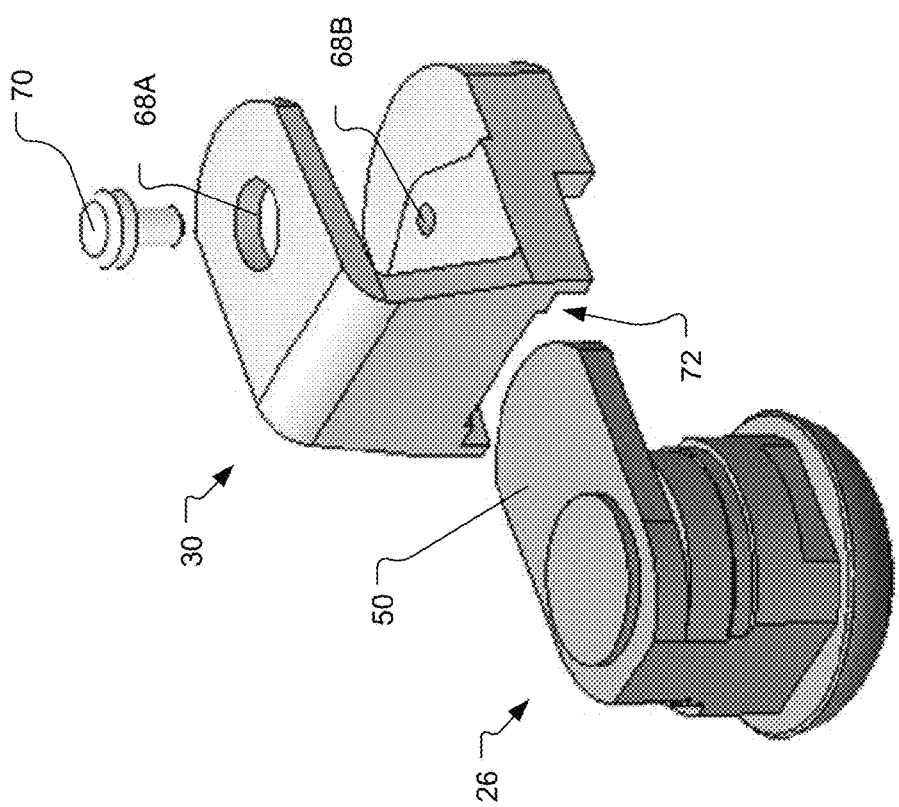

FIGS. 5A-5B illustrate a process of installing the door lock extender 30 to the lock 26. The tang latch 50 of the lock 26 is inserted into the tang latch lock slot 72 of the door lock extender 30. Then, the screw 70 is screwed into the threaded hole in the base aperture 68B. The screw 70 drives against the tang latch 50 to retain and fasten the door lock extender 30 on the lock 26 via an interference fit. Thus, the door lock extender 30 is held in place against the lock 26.

Figure 6:
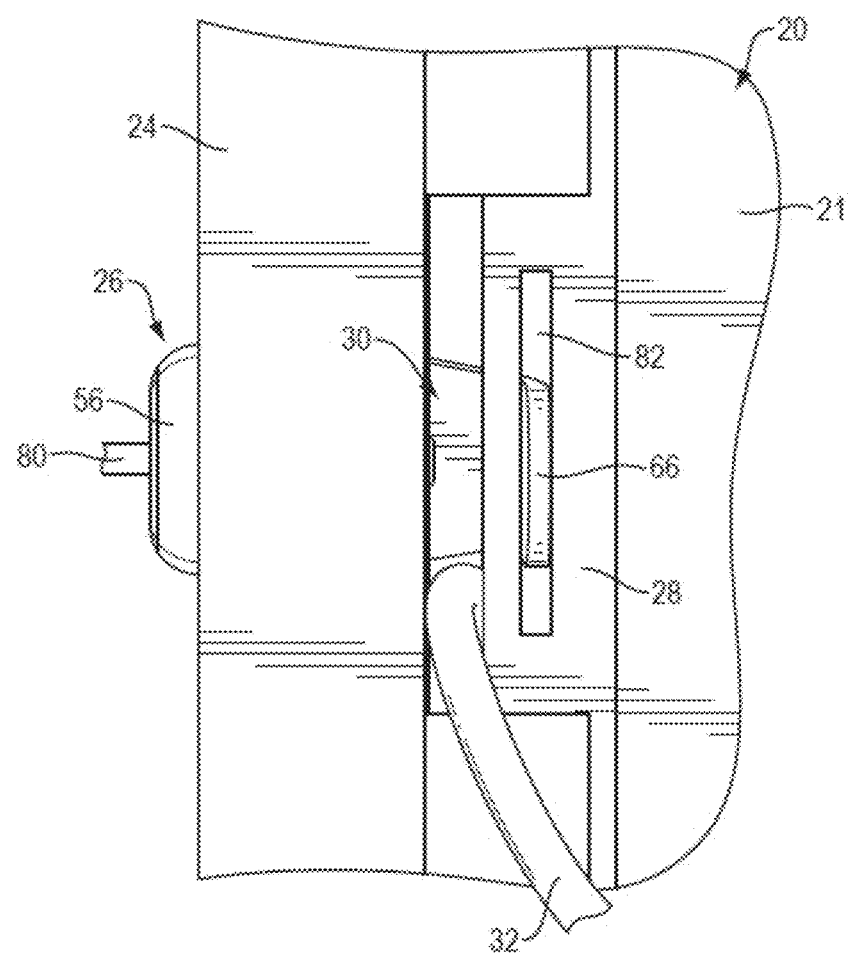
FIG. 6 is a close up view of the door lock extender in use with the control panel box.

FIG. 6 depicts the door lock extender 30 in use with the control panel box 20. As illustrated, the door lock extender 30 functions in tandem with the lock 26 to lock the door 24. In particular, the extender latch 66 engages the catch member 28 locking the door 24 to the housing 21. As shown, the door 24 is locked to the housing 21 while providing sufficient clearance for passage of the cable harness 32 between the door 24 and the housing 21.

While this invention has been particularly shown and described with references to preferred embodiments thereof, it will be understood by those skilled in the art that various changes in form and details may be made therein without departing from the scope of the invention encompassed by the appended claims.

What is claimed is:

1. A door lock extender for a control panel box, comprising:
   an extender base having a bottom side with a lock slot for accepting a tang latch of a lock;
   an extender latch that is configured to engage a catch member of a control panel box;
   a wall extending perpendicularly from a top side of the extender base and extending perpendicularly from a bottom side of the extender latch, wherein the extender base, the wall and the extender latch have a "U" shape when viewed from the side;
   wherein the top side of the extender base faces the extender latch and is spaced apart from the extender latch.

2. The door lock extender of claim 1, wherein the extender base has a base aperture that accepts a screw for securing the extender base to the tang latch of the lock within the lock slot.

3. The door lock extender of claim 2, wherein the extender latch has a latch aperture for receiving a screwdriver to screw the screw into the base aperture.

4. The door lock extender of claim 1, wherein the extender base has a stepped base surface for reinforcing the engagement between the extender latch and the catch member.

5. The door lock extender of claim 1, wherein the extender base and the extender latch are made from a die-cast alloy.

6. The door lock extender of claim 1, wherein the lock slot comprises a lip section and a relief section for retaining the tang latch in the lock slot when the tang latch is slid into the lock slot.

7. The door lock extender of claim 1, wherein the space between the top side of the extender base and the extender latch results in sufficient clearance for a cable to pass between a door and a housing of the control panel box when the extender latch is engaged to the catch member.

8. The door lock extender of claim 1, wherein the lock slot is formed by lip section projecting downward from the extender base, the lip section surrounding a relief section on the bottom side of the extender base, with the tang latch fitting into the relief section and being surrounded by the lip section.

9. The door lock extender of claim 1, wherein the extender base has a base aperture that accepts a screw for securing the extender base to the tang latch within the lock slot and the extender latch includes a latch aperture that is aligned relative to the base aperture to enable a screw driver received through the latch aperture to engage the screw in the base aperture.

10. A control panel box, comprising:
a housing;
at least one bay in the housing for holding a control panel,
a door for the housing enabling access to the at least one bay, wherein the door has a lock attached to a door lock extender for securing the door to the housing; and
the door lock extender enabling the door to be locked to the housing while providing sufficient clearance for passage of a cable between the door and the housing;
wherein the door lock extender comprises an extender latch configured to engage a catch member on the housing, an extender base with a bottom side for attaching to the lock and a top side facing the extender latch and spaced apart from the extender latch, and a wall extending perpendicularly from the top side of the extender base and extending perpendicularly from a bottom side of the extender latch, wherein the extender base, the wall and the extender latch have a "U" shape when viewed from the side.

11. The control panel box of claim 10, wherein the clearance includes a gap of less than 1 centimeter.

12. The control panel box of claim 10, wherein the bottom side of the extender base has a lock slot for accepting a tang latch of a lock.

13. The control panel box of claim 10, wherein the extender base has a base aperture that accepts a screw for securing the extender base to the tang latch of the lock within the lock slot.

14. The control panel box of claim 13, wherein the extender latch has a latch aperture for receiving a screwdriver for screwing the screw into the base aperture.

15. The door lock extender of claim 10, wherein the door lock extender is made from a die-cast alloy.

16. A method of securing a control panel box, comprising:
providing the control panel box having a housing and a door with a lock attached to a door lock extender for securing the door to the housing;
the door lock extender engaging a catch member on the housing of the control panel box locking the door to the housing while providing sufficient clearance for passage of a cable between the door and the housing; and
passing the cable between the door and the housing to connect a control panel in the control panel box to a service box outside the control panel box;
wherein the door lock extender has an extender base and an extender latch, the extender base having a bottom side for attaching to the lock and a top side facing the extender latch and spaced apart from the extender latch.

17. The method of claim 16, wherein the bottom side of the extender base has a lock slot for accepting a tang latch of the lock.

18. The method of claim 16, wherein the door lock extender further comprises a wall extending perpendicularly from the top side of the extender base and extending perpendicularly from a bottom side of the extender latch, wherein the extender base, wall and extender latch have a "U" shape when viewed from the side.

* * * * *